United States Patent
Segawa et al.

(10) Patent No.: US 9,759,488 B2
(45) Date of Patent: Sep. 12, 2017

(54) HEAT TREATMENT APPARATUS

(71) Applicant: Kobe Steel, Ltd., Kobe-shi (JP)

(72) Inventors: Toshiki Segawa, Takasago (JP); Hideyuki Tsumura, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 173 days.

(21) Appl. No.: 14/878,423

(22) Filed: Oct. 8, 2015

(65) Prior Publication Data

US 2016/0187063 A1    Jun. 30, 2016

(30) Foreign Application Priority Data

Dec. 25, 2014   (JP) ................................ 2014-262232

(51) Int. Cl.
| | |
|---|---|
| F27B 9/28 | (2006.01) |
| F27B 9/14 | (2006.01) |
| F27B 9/36 | (2006.01) |
| C23C 14/02 | (2006.01) |
| C23C 14/54 | (2006.01) |
| C23C 14/56 | (2006.01) |
| F26B 13/10 | (2006.01) |

(52) U.S. Cl.
CPC .............. F27B 9/145 (2013.01); C23C 14/02 (2013.01); C23C 14/541 (2013.01); C23C 14/562 (2013.01); F27B 9/28 (2013.01); F27B 9/36 (2013.01); F26B 13/10 (2013.01)

(58) Field of Classification Search
CPC .... C21D 9/52; C21D 9/54; C21D 9/56; F27B 9/28; F27M 2002/11; F26B 13/10; H05B 3/0095; H05B 6/145
See application file for complete search history.

(56) References Cited

U.S. PATENT DOCUMENTS

| | | | |
|---|---|---|---|
| 2009/0029308 A1 | 1/2009 | Ishihara et al. | |
| 2010/0132213 A1* | 6/2010 | Ulrich | F26B 13/18 |
| | | | 34/388 |
| 2011/0139072 A1 | 6/2011 | Tamagaki et al. | |
| 2016/0355903 A1* | 12/2016 | Kwak | C21D 9/561 |

FOREIGN PATENT DOCUMENTS

| | | |
|---|---|---|
| JP | 5-241383 A | 9/1993 |
| JP | 2007-250819 A | 9/2007 |
| JP | 2010-53382 | 3/2010 |
| KR | 10-2011-0034691 A | 4/2011 |
| WO | WO2010/024018 A1 | 3/2010 |

* cited by examiner

*Primary Examiner* — Gregory A Wilson
(74) *Attorney, Agent, or Firm* — Oblon, McClelland, Maier & Neustadt, L.L.P.

(57) ABSTRACT

A heat treatment apparatus includes: a plurality of rollers guiding a substrate, each of the rollers having a roller width greater than a substrate width; a heater including a heating surface which has a width greater than the substrate width; and a heat shield member arranged between a heating surface exposed portion of the heating surface, which is exposed while protruding from an end of the substrate in a width direction of the substrate along the width direction and a roller exposed portion of the specific roller included in the plurality of rollers, the roller exposed portion being exposed while protruding from the end of the substrate in the width direction to the same direction in which the heating surface exposed portion protrudes, the heat shield member shielding heat radiation from the heating surface exposed portion to an outer circumferential surface of the roller exposed portion.

4 Claims, 12 Drawing Sheets

HEAT TREATMENT APPARATUS

BACKGROUND OF THE INVENTION

Field of the Invention

The present invention relates to a heat treatment apparatus for treating a strip-shaped substrate such as a film by heating the substrate.

Description of the Related Art

Conventionally, there is a case where a heat treatment of a thin substrate formed of an elongated film or sheet is performed. For example, a degassing treatment performed before deposition by sputtering or plasma-enhanced chemical vapor deposition (plasma CVD) is known as the foregoing heat treatment. In the degassing treatment, the substrate is heated to remove oligomer or moisture, which remains in the substrate, from the substrate as gas. The substrate is heated, for example, by heat radiation from a heater to the substrate or by a direct contact between a heating roller and the substrate.

Conventionally, apparatuses described in WO2010/024018A and JP2010-053382A (which will be hereinafter referred to as Patent documents 1 and 2, respectively) are known as apparatuses each performing a degassing treatment by means of a heater. The apparatus disclosed in each of Patent documents 1 and 2 is provided with plural rollers each rotatable, plural plate heaters, and a chamber housing the rollers and the plate heaters. The plural rollers are arranged within the chamber so that their rotational central axes are parallel to one another. A film as a substrate is hung over the rollers. Each of the rollers has an outer circumferential surface, which makes contact with the film, and guides the film to be fed along a predetermined pathway while rotating in synchronization with feeding of the film. Each of the plate heaters has a heating surface. The plate heater is arranged so that the heating surface faces a surface of the film which is fed as described above, and the plate heater heats the substrate by heat radiation from the heating surface to the surface of the substrate.

The inventors of the present invention found a particular problem in a heat treatment apparatus based on the combination of plural rollers and a heater as described above that a specific one of the plural rollers is heated by heat radiation from the heater basically for heating a substrate and therefore a temperature of the roller remarkably increases. Thus, a normal heat treatment of the substrate which makes in contact with the rollers may be inhibited. Details of the problem are as follows.

In general, a roller width, i.e., a dimension of each of the rollers in an axial direction is designed to be greater than a width of the substrate (a dimension in a direction perpendicular to a feeding direction of the substrate) in order to surely prevent the substrate to be fed from protruding from the roller in the width direction. Accordingly, both end portions of each of the rollers in the axial direction are exposed while protruding outward from both ends of the substrate in the width direction thereof. Further, in a case where plural types of substrates having different widths are treated by a common heat treatment apparatus, the roller width is designed on the basis of one of the substrates, which has the largest width, so as to be greater than the largest width. Therefore, in a case where one of the substrates, which having a width smaller than the largest width is treated by the heat treatment apparatus, a portion of each of the rollers, which protrudes outward from the substrate in the width direction further increases.

Meanwhile, a width of the heating surface of the heater is generally designed to be greater than the width of the substrate for the purpose of inhibiting an uneven heating of the substrate in the width direction. Specifically, heat at both end portions of the substrate in the width direction is more easily radiated and released around the substrate than an inner portion of the substrate relative to the end portions. That is, the end portions of the substrate are easily cooled; therefore, a temperature of the end portions lowers more easily than temperatures of other portions of the substrate. In order to inhibit such a temperature difference, the width of the heating surface is generally designed to be greater than the largest width of the substrate so that radiation heat is sufficiently applied to the both end portions of the substrate in the width direction. As a result, both end portions of the heating surface in the width direction thereof protrude outward from the substrate in the width direction thereof.

Thus, the outer circumferential surface of the both end portions of each of the rollers in the axial direction and both outside portions of the heating surface are exposed while protruding further outward than the both ends of the substrate in the width direction. Accordingly, heat radiation from the both outside portions of the heating surface to the outer circumferential surface of the both end portions of a specific one of the rollers in the axial direction may directly heat the outer circumferential surface depending on the arrangement of each of the rollers. Such heating not only causes a temperature rising of the both end portions of the specific roller in the axial direction but also causes a temperature rising of a contact area of the outer circumferential surface of the roller, which make contact with the substrate, by heat transfer on the specific roller. Furthermore, a temperature of the heating surface of the heater is generally set higher than a target heating temperature of the substrate. Accordingly, the heat radiation may cause the temperature of the outer circumferential surface of the roller to increase higher than the temperature of the substrate. Thus, when an actual temperature of the substrate increases above the target heating temperature to reach a heat resistant limit of the substrate, the substrate may be thermally damaged. Such unfavorable circumstance may be worse as portions of each of the roller and portions of the heating surface, protruding outward from the substrate in the width direction while not covered by the substrate, are larger, i.e., as differences between the width of each of the rollers and the width of the substrate and between the width of the heating surface and the width of the substrate are larger.

The temperature rising of the roller due to the heat radiation from the heating surface can be inhibited by lowering the temperature of the heating surface. However, lowering of the temperature of the heating surface results in a slowdown in the heat treatment speed and thus leads to an extension of the heat treatment time to decrease treatment efficiency, therefore being inadvisable.

SUMMARY OF THE INVENTION

The object of the present invention is to provide a heat treatment apparatus for performing a heat treatment of a substrate by heating the substrate by a heater while feeding the substrate in a longitudinal direction of the substrate, the substrate having a strip shape extending in the longitudinal direction, the heat treatment apparatus inhibiting the substrate from being thermally damaged by a temperature rising of a roller due to heat radiation from the heater, the roller being arranged for feeding the substrate.

The present invention provides a heat treatment apparatus performing a heat treatment of a substrate by heating the substrate while feeding the substrate in a longitudinal direction of the substrate, the substrate having a strip shape which extends in the longitudinal direction and a specific substrate width, the heat treatment apparatus including: a plurality of rollers guiding the substrate to be fed along a predetermine pathway, each of the rollers including an outer circumferential surface which is contactable with the substrate and a roller width which is greater than the specific substrate width; a heater including a heating surface which has a width greater than the specific substrate width, the heater being arranged so that the heating surface faces a surface of the substrate fed along the pathway, the heater heating the substrate by heating from the heating surface; and a heat shield member inhibiting the outer circumferential surface of the specific roller included in the plurality of rollers from being heated by heat radiation from the heating surface, the heat shield member being arranged between a heating surface exposed portion of the heating surface, which is exposed while protruding from an end of the substrate in a width direction of the substrate along the width direction and a roller exposed portion of the specific roller, which is exposed while protruding from the end of the substrate in the width direction to the same direction in which the heating surface exposed portion protrudes, the heat shield member being shaped to shield the heat radiation from the heating surface exposed portion to the outer circumferential surface of the roller exposed portion.

According to the heat treatment apparatus, the heat shield member shields the heat radiation from the heating surface exposed portion to the outer circumferential surface of the roller exposed portion; thereby, the specific roller is prevented from being heated by the heat radiation. As a result, the substrate is inhibited from being thermally damaged by a temperature rising of the specific roller.

Preferably, the heat treatment apparatus further includes a chamber which surrounds a heat treatment space to house the plurality of rollers and the heater in the heat treatment space. In such case, the chamber preferably includes a heat shield member holding portion which holds the heat shield member so that the heat shield member is detachable. Attachment and removal of the heat shield member enable substrates having different widths from one another to be successfully treated by the same heat treatment apparatus. Specifically, in a case where the substrate having the specific substrate width, the heat shield member is held by the heat shield member holding portion. Thus, the heat radiation from the heating surface exposed portion of the heating surface of the heater protruding outward from the substrate in the width direction thereof to the roller exposed portion of the specific roller is shielded and therefore the temperature rising of the specific roller can be inhibited. Meanwhile, the heat shield member is removed from the heat shield member holding portion; thereby, a substrate having a width greater than the specific substrate width can be treated without interference with the heat shield member.

The heat shield member may have, for example, a cylindrical shape so as to cover the outer circumferential surface of the roller exposed portion from the outside thereof. However, it is preferable that the heat shield member is a heat shield panel which is arranged along a heating face of the heating surface exposed portion so as to face the heating face and cover the heating face. The heat shield panel has a simple shape along the heating face on the heating surface exposed portion, thereby shielding the heat radiation from the heating face to the roller exposed portion of the specific roller. In addition, the heat shield panel is different from a heat shield member of a cylindrical shape which covers the outer circumferential surface of the roller exposed portion, and the heat shield panel may not make contact with the outer circumferential surface of the roller exposed portion and is therefore easily arranged.

The present invention does not restrict the concrete arrangement of the plurality of rollers and the heater. However, the present invention is especially effective in the heat treatment apparatus including the plurality of rollers that includes: a plurality of upper rollers which are arranged at intervals in a predetermined horizontal moving direction; and a plurality of lower rollers which are arranged in a position lower than the upper rollers and at intervals in the moving direction, wherein the heater is a plate heater arranged in a vertically standing manner between portions of the substrate, which are fed in an up and down direction between the upper rollers and lower rollers and which are provided adjacent to each other in the moving direction.

In the heat treatment apparatus, the meandering movement of the substrate between the plurality of upper rollers and the plurality of lower rollers is combined with the arrangement of the plate heater between portions of the substrate, which are adjacent to each other in the moving direction. Therefore, the heat treatment apparatus can be compactly configured to effectively perform the heat treatment of the substrate. On the other hand, the upper rollers and the lower rollers are provided closely to one another in the moving direction and a distance between the heating surface exposed portion of the heater protruding from the substrate in the width direction and the roller exposed portion of the corresponding specific roller to the heating surface exposed portion is small. Therefore, in a case where the outer circumferential surface of the roller exposed portion is thermally radiated from the heating surface exposed portion, a temperature of the roller exposed portion remarkably increases. However, the heat shield member is provided between the heating surface exposed portion and the roller exposed portion; thereby, the temperature rising of the specific roller can be effectively inhibited regardless of whether each of the rollers and the plate heater are provided closely.

As described above, the present invention provides a heat treatment apparatus for performing a heat treatment of a substrate by heating the substrate by a heater while feeding the substrate in the longitudinal direction of the substrate, the substrate having a strip shape extending in the longitudinal direction, the heat treatment apparatus inhibiting the substrate from being thermally damaged by a temperature rising of a roller due to heat radiation from the heater, the roller being arranged for feeding the substrate.

DESCRIPTION OF THE PREFERRED EMBODIMENTS

Figure 1:
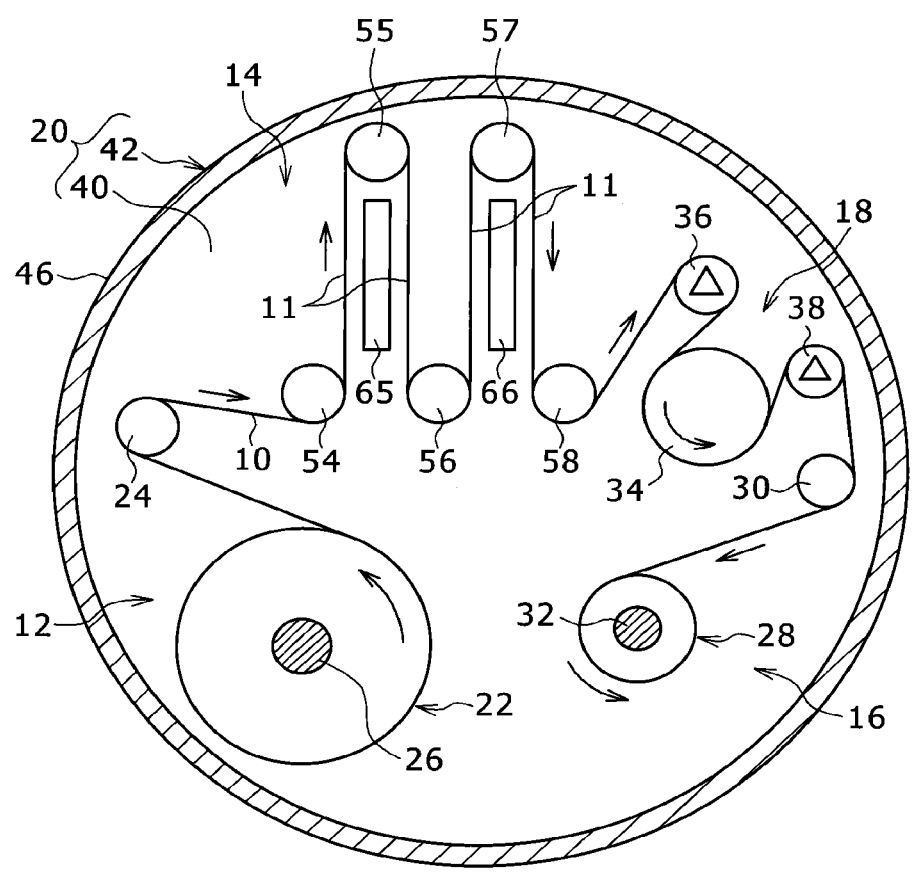
FIG. 1 is a front sectional view of a degassing apparatus according to a first embodiment of the present invention.

Hereinafter, preferred embodiments of the present invention will be described by referring to the drawings. In addition, an example of a heat treatment apparatus to which the present invention is applied includes a degassing apparatus, but the present invention is not limited to the degassing apparatus. The present invention can be applied to other heat treatments, for example, to a heat shrinking apparatus by which a substrate formed of a plastic film is heated to be shrunk and deformed.

FIG. 1 to FIG. 9 show a degassing apparatus according to a first embodiment of the present invention. The degassing apparatus according to the first embodiment performs, for example, a degassing treatment of a substrate 10 before a deposition treatment.

The substrate 10 is of a stripped shape having a longitudinal direction. The degassing apparatus performs the degassing treatment by heating the substrate 10 while feeding the substrate 10 in the longitudinal direction. Such degassing treatment is, for example, a treatment in which the substrate 10 is heated to thereby separate oligomer or moisture contained in the substrate 10 therefrom as gas. Materials of the substrate 10 are not limited. The substrate 10 may be formed of, for example, a film of plastic such as PET (Polyethylene Terephthalate), or a metallic foil such as an aluminum foil or an SUS (stainless steel) foil.

As shown in FIG. 1, the degassing apparatus according to the first embodiment includes a substrate supply portion 12, a degassing portion 14, a substrate collecting portion 16, a tension adjustment portion 18, and a vacuum chamber 20 serving as a chamber. The substrate supply portion 12 supplies the pre-degassed substrate 10 to the degassing portion 14. The degassing portion 14 heats the supplied substrate 10 to thereby remove gas from the substrate 10. The substrate collecting portion 16 collects the degassed substrate 10. The tension adjustment portion 18 provided between the degassing portion 14 and the substrate collecting portion 16 drives the substrate 10 in the feeding direction and detects a tension of the substrate 10. The vacuum chamber 20 surrounds a degassing space (serving as a heat treatment space), which can produce vacuum, and houses the substrate supply portion 12, the degassing portion 14, and the substrate collecting portion 16 in the degassing space.

The substrate supply portion 12 includes a substrate supply roller 22 and a guide roller 24 at downstream of the substrate supply roller 22. The substrate supply roller 22 is configured by a roller shaft 26 and the pre-degassed substrate 10 rolled around the roller shaft 26. The substrate supply roller 22 rolls out the pre-degassed substrate 10 along with rotation of the roller shaft 26.

The degassing portion 14 includes plural guide rollers and plural heaters. The plural guide rollers are arranged so as to guide the substrate 10 to be fed along a predetermined pathway. The plural heaters are arranged so as to heat a surface of the substrate 10 fed along the pathway, by heat radiation. Details of the degassing portion 14 will be described below.

The substrate collecting portion 16 includes a substrate collecting roller 28 and a guide roller 30 at upstream of the substrate collecting roller 28. The substrate collecting roller 28 is configured by a roller shaft 32 and the degassed substrate 10 rolled around the roller shaft 32. The substrate collecting roller 28 rolls up the degassed substrate 10 around the roller shaft 32 along with rotation of the roller shaft 32.

The tension adjustment portion 18 includes a drive roller 34, tension detection rollers 36, 38 respectively arranged at upstream and downstream of the drive roller 34, a motor (not shown) connected to the drive roller 34, and a controller (not shown). The tension detection rollers 36, 38 detect tensions of the substrate 10 at upstream and downstream of the drive roller 34, respectively. The motor drives the drive roller 34 to rotate the drive roller 34 in a direction indicated by arrows in FIG. 1, i.e., in the direction corresponding to the feeding direction. The controller controls the rotation of the drive roller 34 driven by the motor so that a difference between the tensions detected by the tension detection rollers 36, 38 may be approximated to a predetermined target value.

In the present invention, a concrete configuration of each portion other than the degassing portion 14 will not be limited. For example, the substrate supply portion 12 or the substrate collecting portion 16 may be arranged at a section outside the vacuum chamber 20.

Figure 2:
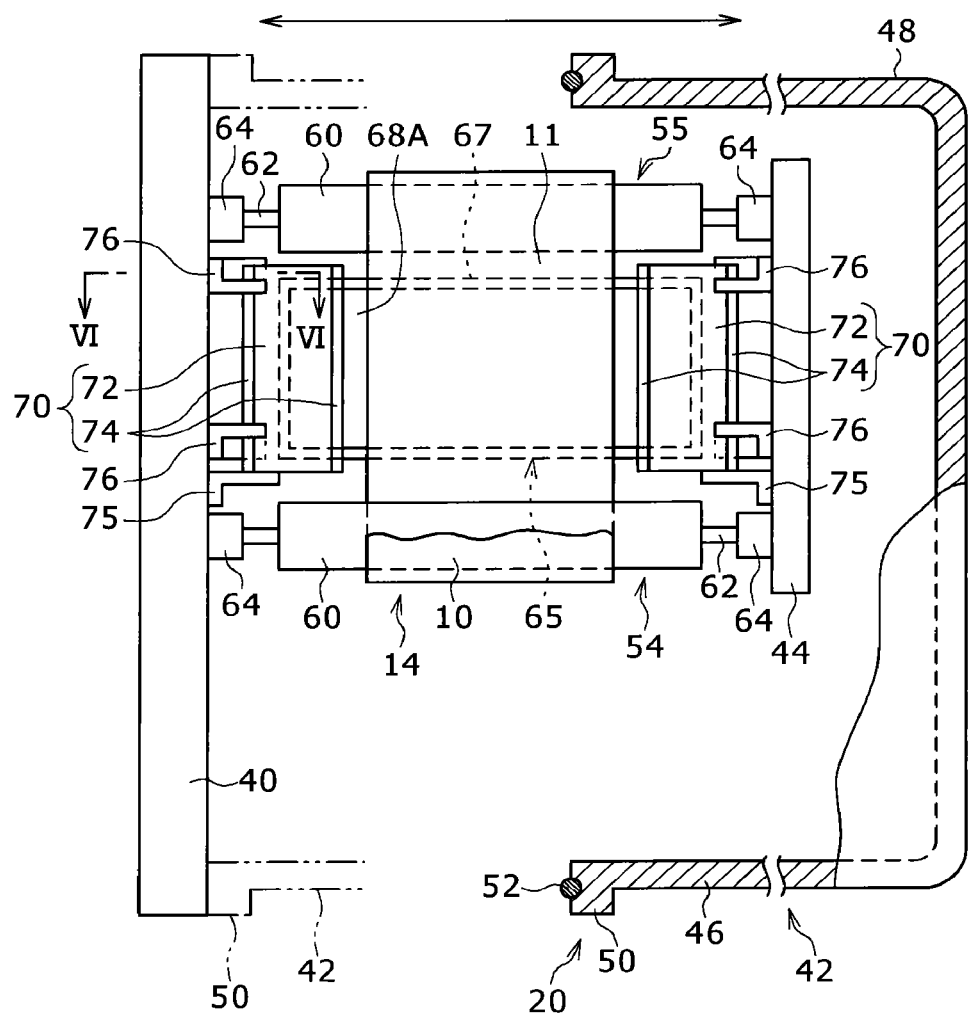
FIG. 2 is a partial side sectional view of the degassing apparatus.
Figure 3:
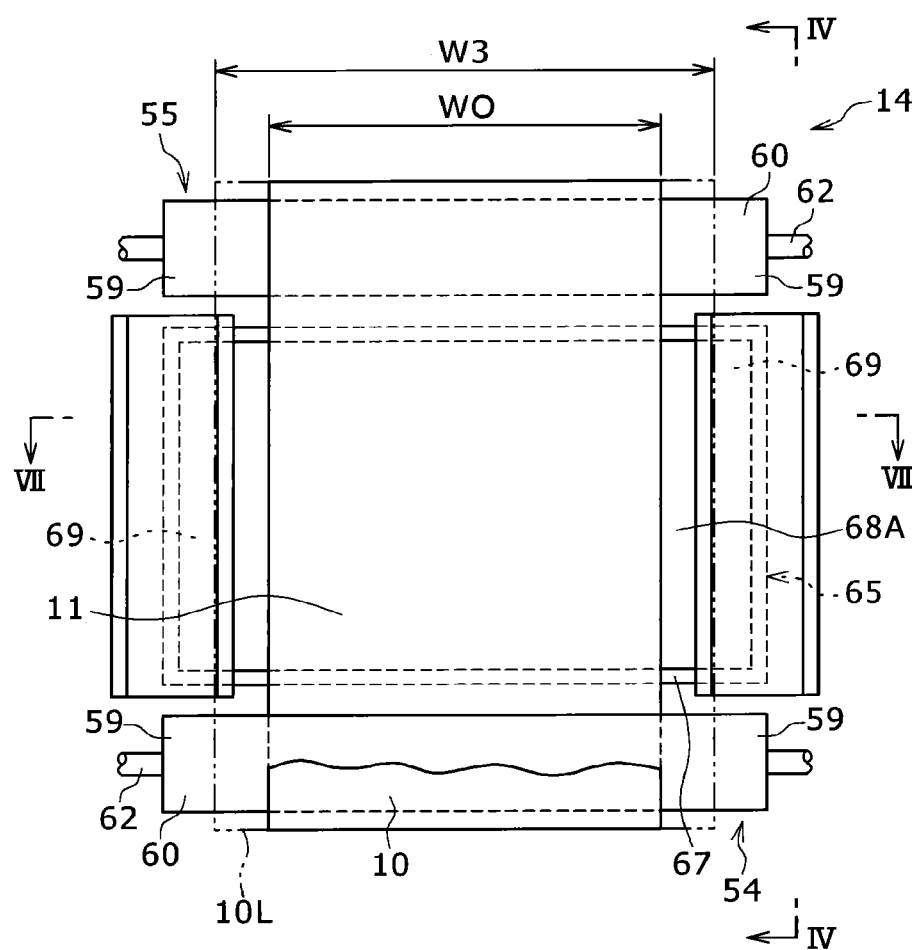
FIG. 3 is a side view of a degassing portion of the degassing apparatus.

As shown in FIG. 1 and FIG. 2, the vacuum chamber 20 includes a discoid vacuum flange 40 and a chamber body 42 formed of a container which is opened to the vacuum flange 40. As indicated by an arrow in FIG. 2, the vacuum flange 40 and the chamber body 42 can move relative to each other between a closed position in which the vacuum flange 40 and the chamber body 42 are closely attached to each other to form the degassing space and tightly seal the degassing space and an opened position in which the vacuum flange 40 and the chamber body 42 are separated from each other to allow the substrate supply portion 12, the degassing portion 14, the substrate collecting portion 16, and the tension adjustment portion 18 to be opened to the outside.

The vacuum flange 40 holds one end portion of a component included in each of the substrate supply portion 12, the degassing portion 14, the substrate collecting portion 16, and the tension adjustment portion 18 and supports the component via the single end portion. The other end portion of the component is connected to a common support flange 44 which is shown in FIG. 2.

The chamber body 42 includes a cylindrical circumferential wall 46 surrounding the substrate supply portion 12, the degassing portion 14, the substrate collecting portion 16, and the tension adjustment portion 18 as shown in FIG. 1, and an end wall 48 closing one of both axial end portions of the circumferential wall 46, which is axially on opposite side of the vacuum flange 40 with respect to the circumferential wall 46. The other of the both axial end portions of the circumferential wall 46, which is axially on opposite side of the end wall 48 with respect to the circumferential wall 46, configures an annular flange portion 50. A seal ring 52 is arranged at the flange portion 50. The seal ring 52 can be closely attached to a circumferential edge portion of the vacuum flange 40 while being elastically deformed in a state where the chamber body 42 is in the closed position. Further, the chamber body 42 includes a portion for holding the support flange 44 in a state where the chamber body 42 is in the closed position.

Furthermore, a roller shaft of each of the rollers other than the roller shafts 26, 32 is not shown in FIG. 1 for convenience. In addition, only the degassing portion 14 out of the substrate supply portion 12, the degassing portion 14, the substrate collecting portion 16, and the tension adjustment portion 18 is shown in FIG. 2 and other portions are not illustrated.

Next, the details of the degassing portion 14 will be explained with reference to FIG. 3 to FIG. 7.

Figure 4:
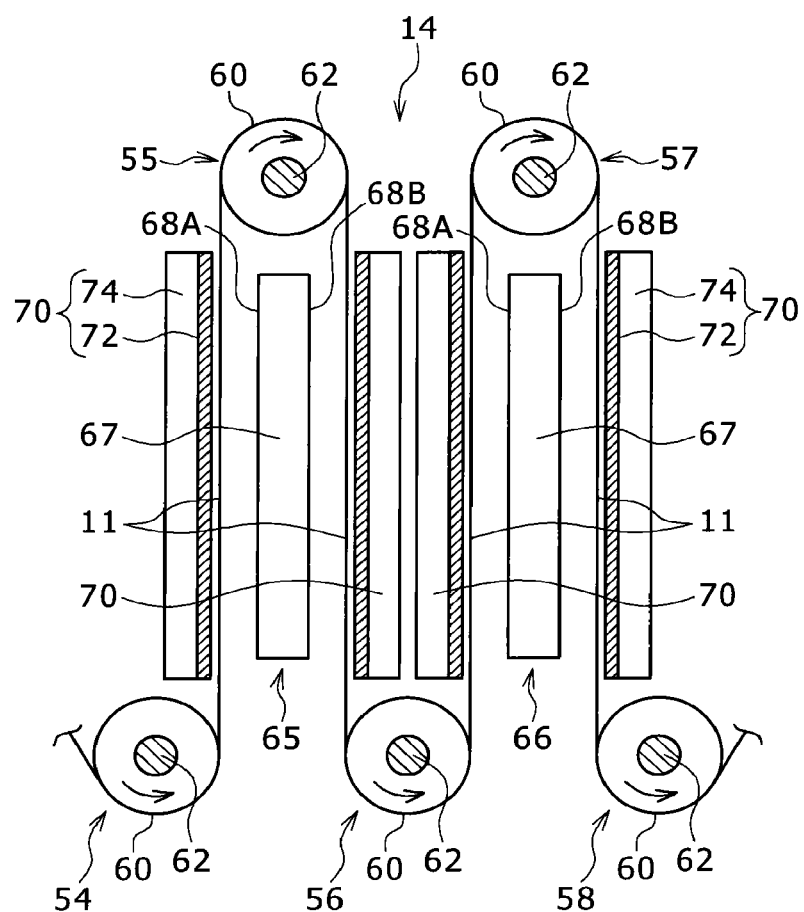
FIG. 4 is a sectional view taken along the line IV-IV of FIG. 3.

In the first embodiment, as shown in FIG. 4, the plural guide rollers included in the degassing portion 14 are arranged to guide the substrate 10 so that the substrate 10 is fed in an up to down direction while being moved in a right to left direction which is a specific moving direction perpendicular to the up to down direction, i.e., so that the substrate 10 is moved in a meandering manner. Specifically, the plural guide rollers include three lower rollers 54, 56, 58 and two upper rollers 55, 57. The lower rollers 54, 56, 58 are arranged in a position on a specific level in the up to down direction and at intervals substantially identical to diameters of the upper rollers 55, 57 in the moving direction (in the right to left direction). The upper rollers 55, 57 are arranged in a position above the position of the lower rollers 54, 56, 58 in the up to down direction and at intervals to each other.

Each of the rollers 54 to 58 includes a cylindrical outer circumferential surface 60. A roller support shaft 62 protrudes further outward from both ends of each roller 54 to 58 in the width direction thereof (in the right to left direction in FIG. 2, FIG. 3, and FIG. 5, in a direction perpendicular to the right to left direction in FIG. 4). As shown in FIG. 2, the roller support shaft 62 is rotatably supported via a right and left pair of bearings 64 by the vacuum flange 40 and the support flange 44 of the vacuum chamber 20.

With respect to the rollers 54 to 58, the substrate 10 is hung over a lower portion of the outer circumferential surface 60 of each of the lower rollers 54, 56, 58 and an upper portion of the outer circumferential surface 60 of each of the upper rollers 55, 57 in a zig-zag manner so as to be alternatively in contact with the lower portion and the upper portion, respectively. Therefore, a feeding force along the longitudinal direction of the substrate 10 is applied thereto; thereby, each of the rollers 54 to 58 guides the substrate 10 while rotating so that the substrate 10 is fed in the up to down direction while moving in the right to left direction (i.e., so that the substrate 10 is moved in a meandering manner).

In the first embodiment, the plural heaters included in the degassing portion 14 include plate heaters 65, 66. Each of the plate heaters 65, 66 having a flat plated shape is arranged in a position to effectively heat the substrate 10 by its own heat generation and heat radiation. Specifically, the substrate 10 hung over the rollers 54 to 58 so as to be fed in the up to down direction as described above includes plural vertical portions 11 arranged in the moving direction (four vertical portions in total in the first embodiment). The plate heaters 65, 66 are each arranged between the vertical portions 11 positioned at both sides of each upper roller 55, 57 in the right to left direction in FIG. 4, that is, the plate heater 65, 66 is arranged in a position lower than each upper roller 55, 57 in a vertically standing manner.

Each of the plate heaters 65, 66 includes a heater body of a rectangular shape and a frame body 67 surrounding an outer periphery of the heater body. The frame body 67 has heat insulation properties. The heater body includes a front and back pair of heating surfaces 68A, 68B, and the heating surfaces 68A, 68B are exposed in an area at an inner side of the frame body 67. Each plate heater 65, 66 is arranged in such that the heating surfaces 68A, 68B respectively face surfaces of the vertically extending portions 11 of the substrate 10, and the vertically extending portions 11 are heated by the heat radiation from the heating surfaces 68A, 68B to the vertically extending portions 11.

The degassing apparatus further includes plural heat shield panels 70 each serving as a heat shield member. The heat shield panel 70 inhibits a temperature rising of a specific one of the rollers 54 to 58 due to the heat radiation from each of the plate heaters 65, 66 to the specific roller and thereby serve to inhibit the substrate 10 from being thermally damaged by the temperature rising.

Figure 12:
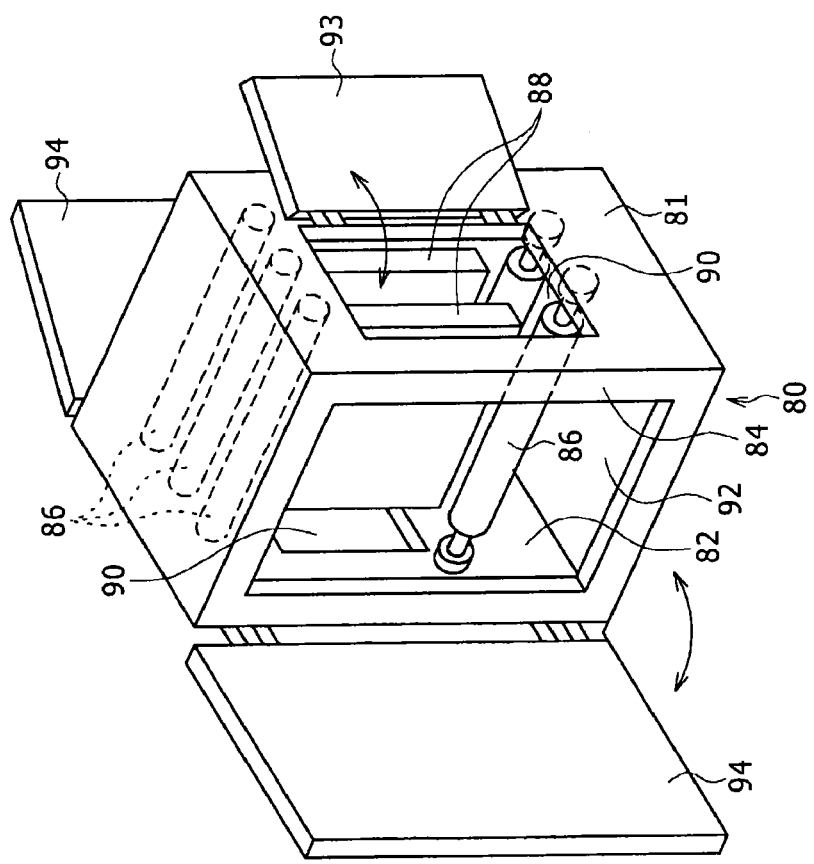
FIG. 12 is a perspective view of the degassing apparatus according to a second embodiment of the present invention.

Before explaining the heat shield panels 70, reasons of the occurrence of heating by the heat radiation from the heating surfaces 68A, 68B of each of the plate heaters 65, 66 to the specific roller will be described with reference to the configuration illustrated in FIG. 1 and FIG. 12, i.e., the configuration not including the heat shield panels 70.

Heating by the heat radiation from the heating surfaces 68A, 68B to each of the rollers 54 to 58 is caused by the followings: 1) exposure of each roller 54 to 58 protruding from the substrate; 2) exposure of the heating surfaces 68A, 68B of each plate heater 65, 66, which protrude from the substrate; and 3) heat radiation between the exposed portions.

1) Exposure of Each Roller 54 to 58 Protruding from the Substrate

The degassing apparatus is adapted to treatments of plural types of substrates having different widths (dimensions in a direction perpendicular to the longitudinal direction), therefore being designed to be suitable for one of the substrates, which has the largest width. Specifically, a roller width Wr (an axial dimension shown in FIG. 10) of each roller 54 to 58 is designed to be greater than the largest width so that all of the substrates including the substrate having the largest width can be successfully fed.

Figure 10:
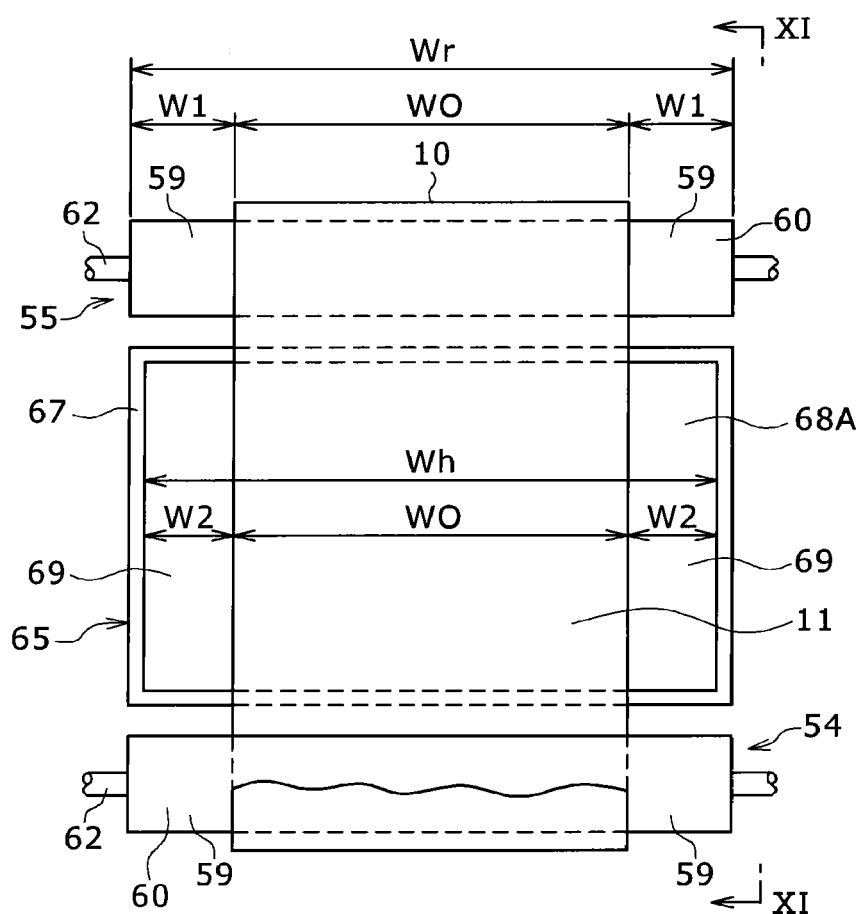
FIG. 10 is a side view illustrating a configuration in which the heat shield member is removed from the degassing portion.

Accordingly, in a case where the substrate 10 having a substrate width W0 shown in FIG. 10 and smaller than the largest width is hung over an intermediate portion of each of the rollers 54 to 58 in the width direction thereof, both end portions of each roller 54 to 58 largely protrude outward from both ends of the substrate 10 in the width direction thereof. Portions of the outer circumferential surface 60, which are exposed while not being covered by the substrate 10 as above, i.e., roller exposed portions 59 each has a width W1, and the width W1 is indicated by the following formula.

$$W1=(Wr-W0)/2$$

As indicated in the formula, the greater a difference between the roller width Wr and the substrate width W0 is, the greater the width W1 of each of the roller exposed portions 59 is. For example, in an apparatus in which a roller width of each roller 54 to 58 is set at 1400 mm so that a substrate having the largest width of 1340 mm can be treated, in a case where the substrate width W0 of the substrate 10 to be actually treated is 1000 mm, the roller exposed portions 59 each having the width W1 of 200 mm are generated at both outer sides of the substrate 10 in the width direction thereof.

2) Exposure of the Heating Surfaces 68A, 68B of Each Plate Heater 65, 66, which Protrude from the Substrate A width Wh of the heating surface 68A, 68B of each of the plate heaters 65, 66 shown in FIG. 10 is also designed to be greater than the largest width of the substrate for the purpose of inhibiting the substrate from being unevenly heated in the width direction. Specifically, heat at both end portions of the substrate in the width direction is more easily radiated and released around the substrate than an inner portion of the substrate relative to the end portions. That is, the end portions of the substrate are easily cooled; therefore, a temperature of the end portions easily lowers compared to temperatures of other portions of the substrate. In order to inhibit such a temperature difference, the width Wh of the heating surface 68A, 68B is designed to be greater than the largest width of the substrate so that radiation heat is sufficiently applied to the both end portions of the substrate in the width direction.

Therefore, in a case where the substrate 10 having the substrate width WO (smaller than the largest width) is hung over the intermediate portion of each roller 54 to 58 in the width direction as described above, both end portions of the heating surface 68A, 68B in the width direction thereof largely protrude outward from the both ends of the substrate 10 in the width direction thereof in the same way as the outer circumferential surface 60 of the roller. Portions of the heating surface 68A, 68B, which are exposed while not being covered by the substrate 10 as described above, i.e., heating surface exposed portions 69 each has a width W2, and the width W2 is indicated by the following formula.

$$W2 = (Wh - WO)/2$$

As indicated in the formula, the greater a difference between the width Wh of the heating surface 68A, 68B and the substrate width WO is, the greater the width W2 of each of the heating surface exposed portions 69 is. For example, in an apparatus in which a width of the heating surface 68A, 68B is set at 1400 mm so that a substrate having the largest width of 1340 mm can be treated, in a case where the substrate width WO of the substrate 10 to be actually treated is 1000 mm, the heating surface exposed portions 69 each having the width W2 of 200 mm are generated at the both outer sides of the substrate 10 in the width direction thereof.

3) Heat Radiation Between the Exposed Portions

Figure 11:
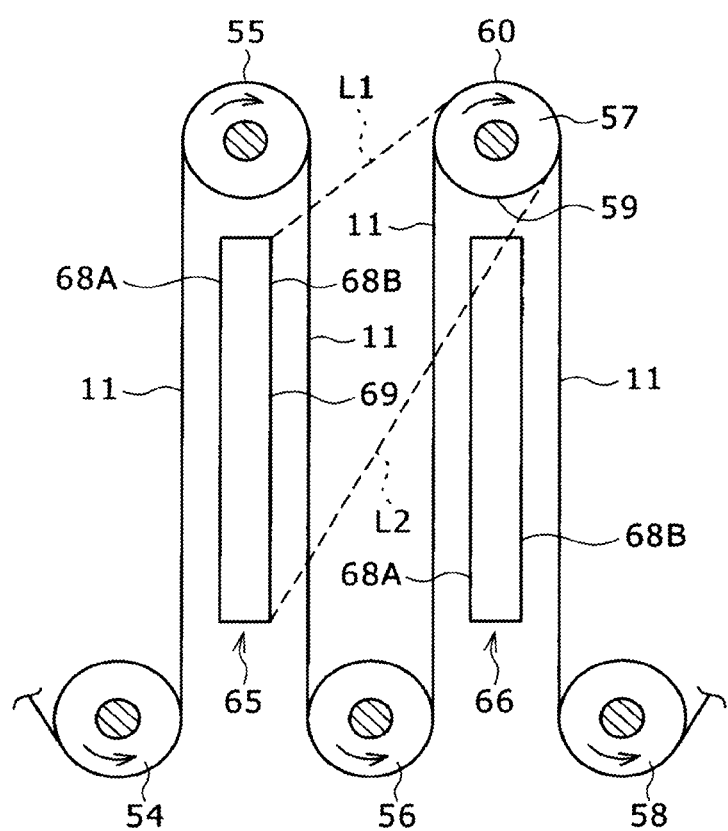
FIG. 11 is a sectional view taken along the line XI-XI of FIG. 10.

As described above, each roller 54 to 58 and the heating surface 68A, 68B respectively include exposed portions which are exposed from the substrate 10 while not being covered by the substrate 10, i.e., the roller exposed portion 59 and the heating surface exposed portion 69. Therefore, a direct heat radiation from the heating surface exposed portion 69 to the outer circumferential surface 60 of the roller exposed portion 59 may occur. For example, as shown in FIG. 11, when being focused on a relation between the heating surface 68B of the plate heater 65 and the upper roller 57, the exposed portion of the heating surface 68B can heat the outer circumferential surface 60 of the exposed portion of the upper roller 57 by the heat radiation in a pathway between upper and lower dashed lines L1, L2 shown in FIG. 11.

Such heating may not only cause a raise in temperature of a portion of the outer circumferential surface 60 of the upper roller 57, which is exposed at the outer side of the substrate 10, but also cause by heat transfer on the upper roller 57, a rise in temperature of a portion of the outer circumferential surface 60 of the upper roller 57, which makes contact with the substrate 10, and further a rise in temperature of the substrate 10. Furthermore, a temperature of the heating surface 68A, 68B is generally set higher (for example, 200 degrees Celsius) than a target heating temperature (for example, 150 degrees Celsius) of the substrate 10. Accordingly, the temperature of the upper roller 57 and the temperature of the substrate 10 making in contact with the upper roller 57 may be increased by the heat radiation to the roller exposed portion 59 to be higher than the target heating temperature. Thus, when the temperature of the substrate 10 reaches a heat resistant limit thereof, the substrate 10 may be thermally damaged. Heating of the roller exposed portion by such heat radiation may be remarkably generated similarly by other heat radiations from the heating surface 68B of the plate heater 65 to the lower roller 58 and from the heating surface 68A of the plate heater 66 to the upper roller 55 and the lower roller 54.

Each of the heat shield panels 70 is used when the substrate 10 having the substrate width WO is treated. The heat shield panels 70 are respectively arranged so as to shield the heat radiations which may be generated as described above when the substrate 10 is treated and so as to inhibit the temperature rising of each roller due to the heat radiations. Specifically, the heat shield panels 70 according to the first embodiment are arranged at both outer sides of the respective vertical portions 11 in the width direction of the substrate 10 having the substrate width WO, and each of the heat shield panels 70 has a shape which covers an entire area of the heating surface exposed portion 69 of the heating surface 68A, 68B of each of the plate heaters 65, 66 in the up and down direction thereof.

Figure 5:
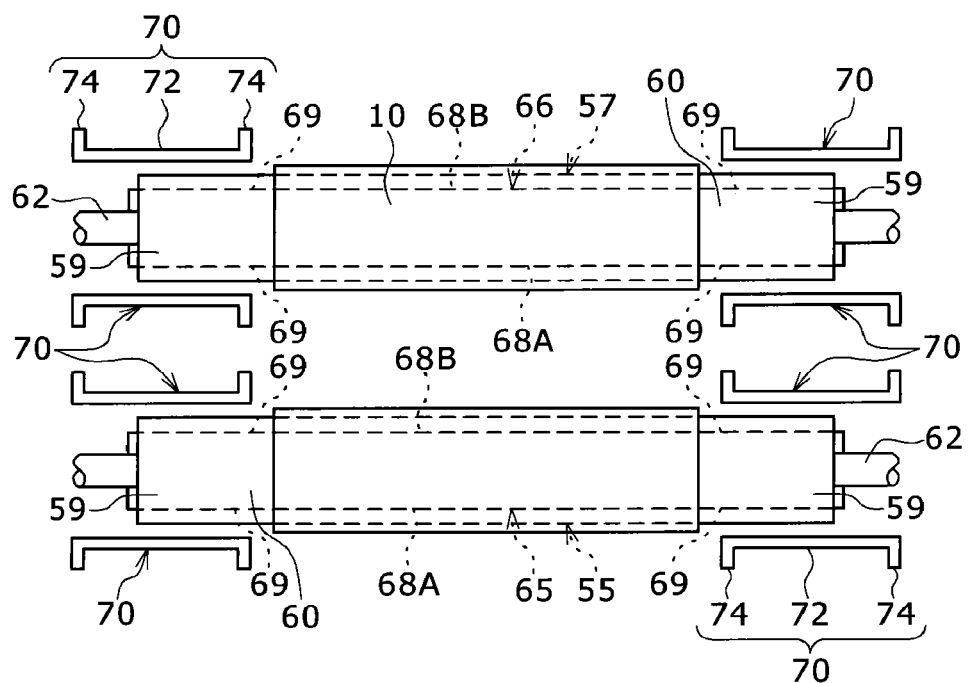
FIG. 5 is a plan view of the degassing portion.

Specifically, as shown in FIG. 4 and FIG. 5, each heat shield panel 70 integrally includes a body portion 72 extending along the corresponding heating surface in the up and down direction and a pair of ribs 74. The body portion 72 is arranged in a position so that its plate thickness direction is parallel to a thickness direction of the substrate 10. The body portion 72 has a width sufficient for covering the heating surface exposed portion 69, excluding an area of the heating surface exposed portion 69, which is adjacent to each of both edge portions of the substrate 10 in the width direction thereof. The pair of ribs 74 extends along the body portion 72 in the up and down direction and protrudes outward from both ends of the body portion 72 in the width direction thereof, i.e., in a direction opposite to the corresponding heating surface. The ribs 74 may be omitted as appropriate.

The heat shield panel 70 may be formed by a material which effectively shields the heat radiation from the heating surface exposed portion 69 to the roller exposed portion 59, and the material may be selected within such extent as appropriate. Specifically, it is preferable that the material includes a laminated structure formed by plural thin plates. In view of easiness of handling the heat shield panel 70 and inhibition of a temperature rising of the heat shield panel 70, the thin plate is preferably made of a lightweight material superior in heat dissipation, such as a material made of aluminum or aluminum alloy. Alternatively, the heat shield panel 70 may be cooled, for example, by water or the like.

A dimension of each of the heat shield panels 70 in the up and down direction is desirably established to shield the heat radiation from the target heating surface exposed portion to the roller exposed portion over the whole area in the up and down direction. Alternatively, the dimension of the heat shield panel 70 in the up and down direction may be established to only partially shield the heat radiation. The greater the shielding degree for the heat radiation is, the more remarkably a temperature rising of the target roller exposed portion is inhibited; therefore, the substrate is further surely inhibited from being thermally damaged.

Figure 7:
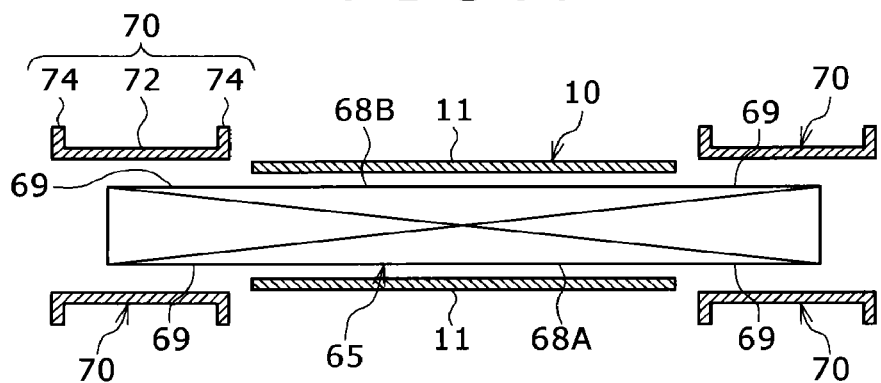
FIG. 7 is sectional view taken along the line VII-VII of FIG. 3.

In addition, according to the same idea as above, a portion of the heat shield panels 70 illustrated in FIG. 4 and FIG. 7 may be omitted. In particular, the heat shield panels 70 at the outer sides in the right and left direction in FIG. 4 are inferior to the heat shield panels 70 at the inner side in the degree of contribution to the inhibition of the temperature rising of the rollers 54 to 58. Therefore, even in a case where the heat shield panels 70 at the outer sides in the right and left direction are omitted, an influence of such omission on the temperature of the rollers 54 to 58 is relatively small.

Figure 8:
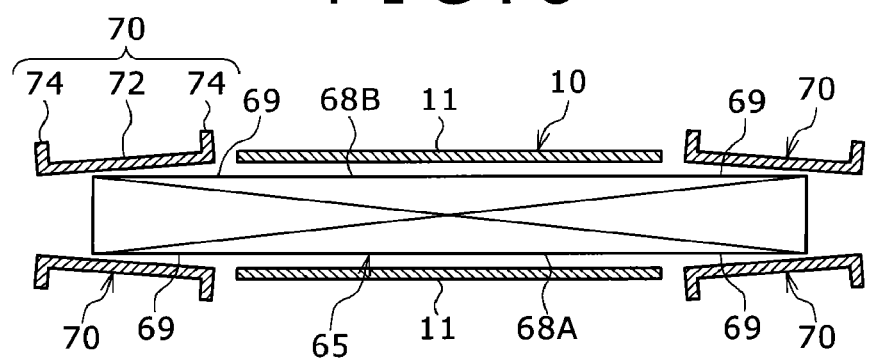
FIG. 8 is a plan sectional view illustrating a modified example of the arrangement of a heat shield member in the degassing apparatus.
Figure 9:
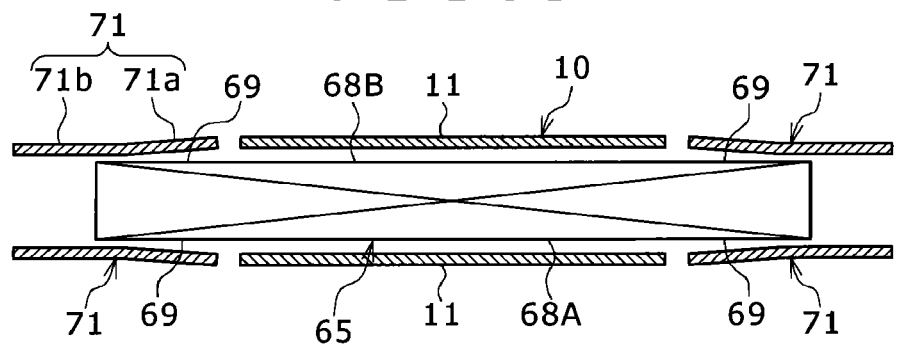
FIG. 9 is a plan sectional view illustrating a modified example of a shape of the heat shield member in the degassing apparatus.

The arrangement, the shape, or the like of each of the heat shield panels 70 may be modified as appropriate as long as the heat shield panel 70 can shield the heat radiation. For example, as shown in FIG. 8, each heat shield panel 70 may be arranged in a position to be slightly inclined to the heating surface 68A, 68B. Alternatively, a heat shield panel 71 having a shape as shown in FIG. 9 may be applied. The heat shield panel 71 includes: an inner side portion 71a which inclined so as to come closer to the heating surface 68A or the heating surface 68B in a direction from the inner side to the outer side in the width direction of the substrate 10; and an outer side portion 71b which extends outward from an outer end of the inner side portion 71a in the width direction of the substrate 10 and parallel to the heating surface 68A or the heating surface 68B.

Figure 6:
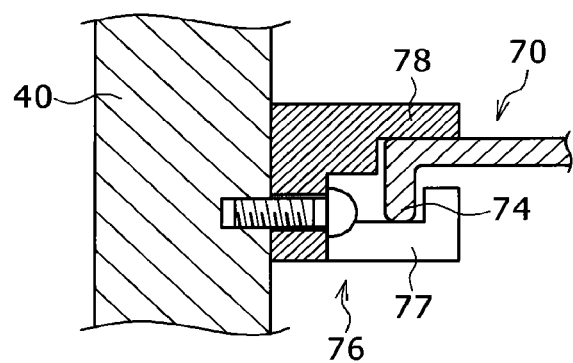
FIG. 6 is a sectional view taken along the line VI-VI of FIG. 2.

The vacuum chamber 20 includes plural heat shield panel holding portions (each serving as a heat shield member holding portion) which hold the heat shield panels 70 so that the heat shield panels 70 are respectively detachable. As shown in FIG. 2, each of the heat shield panel holding portions includes a heat shield panel supporting member 75 and an upper and lower pair of heat shield panel double-supporting members 76. The heat shield panel supporting member 75 and the heat shield panel double-supporting members 76 are fixed onto an inner surface of one flange of the vacuum flange 40 and the support flange 44, which is closer to the heat shield panel holding portion. The heat shield panel supporting member 75 is provided at a lower side of the corresponding heat shield panel 70 to support the heat shield panel 70. The heat shield panel supporting member 75 includes an upper surface on which the heat shield panel 70 can be mounted. As shown in FIG. 6, each of the heat shield panel double-supporting members 76 includes a pair of holding portions 77, 78 arranged at an interval in the plate thickness direction of the body portion 72 of the heat shield panel 70, and the rib 74 of the heat shield panel 70 is provided in an appropriate position above the heat shield panel supporting member 75 in the up and down direction so as to be held between the holding portions 77, 78.

With the heat shield panel holding portion, each heat shield panel 70 is inserted from above between the holding portions 77, 78 of the corresponding heat shield panel double-supporting member 76 in a state where as shown in FIG. 2, the chamber body 42 of the vacuum chamber 20 is moved in the opened position in which the chamber body 42 is separated from the vacuum flange 40 and the degassing portion 14 is thereby opened to the outside. Then, the heat shield panel 70 is inserted downward to a position to be brought into contact with the heat shield panel supporting member 75. Therefore, the heat shield panel 70 can be set in its appropriate position to be fixed in the position by means of a fastener such as a bolt. Meanwhile, the heat shield panel 70 can be easily removed from the vacuum chamber 20 by operations in the reverse order of the inserting operation.

Such attachment and removal of the heat shield panel 70 enable substrates having different widths from one another to be successfully treated by the same degassing apparatus. Specifically, in the event of treating the substrate 10 having the substrate width WO, the heat shield panel 70 is held by the heat shield panel holding portion as described above; thereby, the heat radiation from the heating surface exposed portion 69 of the plate heater 65, 66 to the roller exposed portion 59 of the specific roller is shielded and a temperature rising of the specific roller can be inhibited. Meanwhile, the heat shield panel 70 is removed from the heat shield panel holding portion; thereby, a substrate 10L having a substrate width W3 (for example, the largest width) greater than the substrate width WO, for example, as indicated by two-dot chain lines in FIG. 3 can be thermally treated without interference with the heat shield panel 70.

Further, the present invention may be provided with plural types of heat shield members depending on plural types of substrate widths. For example, in order to treat a substrate having a substrate width greater than the substrate width WO shown in FIG. 3, instead of the heat shield panel 70 shown in FIG. 3, a second heat shield panel having a width smaller than a width of the heat shield panel 70 may be attached. The width of the second heat shield panel may be established in such that the second heat shield panel does not interfere with the substrate having the width greater than the substrate width WO and can cover portions of the heating surface 68A, 68B, which are exposed while protruding outward from the substrate in the width direction thereof.

Figure 13:
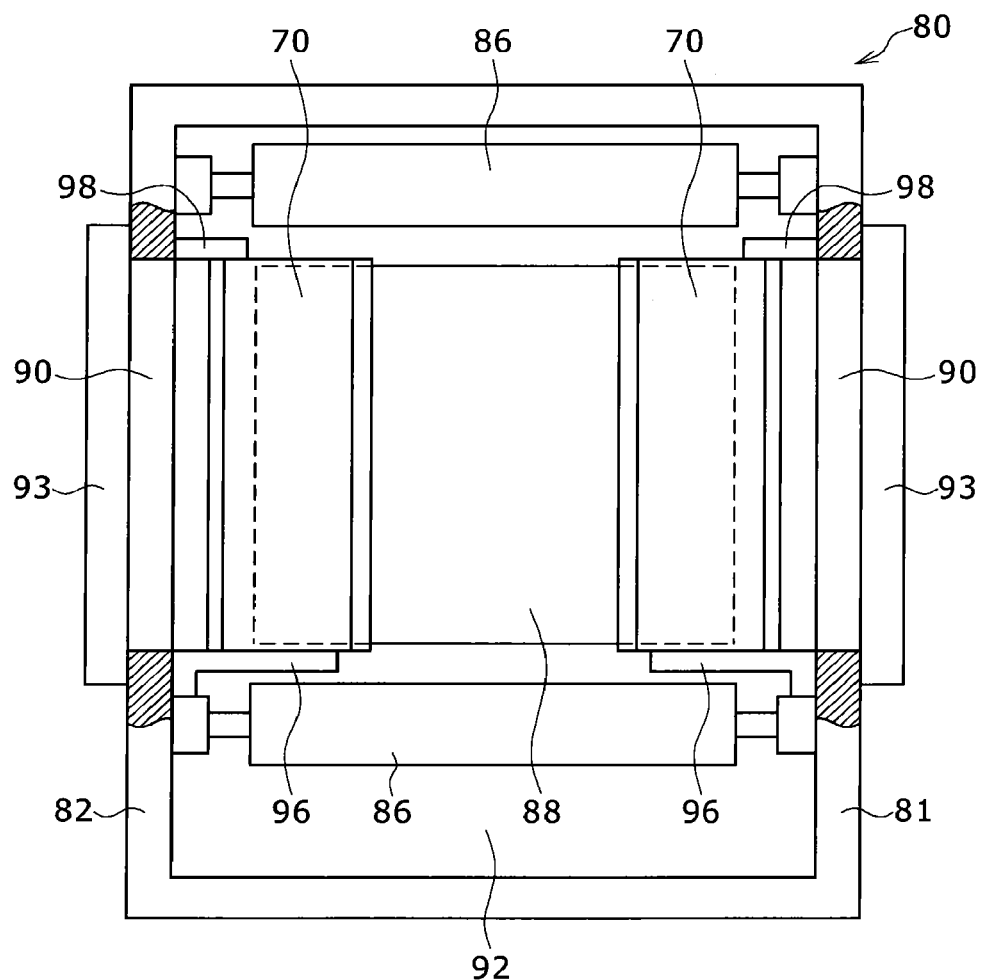
FIG. 13 is a partial side sectional view of the degassing apparatus illustrated in FIG. 12.

The heat shield panel holding portion for supporting the heat shield panel 70 so that the heat shield panel 70 is detachable as described above is not limited to the configuration allowing the heat shield panel 70 to be inserted from above as described above. The concrete configuration of the heat shield panel holding portion can be designed as appropriate depending on a structure of a chamber which includes the heat shield panel holding portion. Such example will be shown as a second embodiment of the present invention in FIG. 12 and FIG. 13.

The degassing apparatus according to the second embodiment includes a vacuum chamber 80 as a chamber of the apparatus, and the vacuum chamber 80 is formed of a substantially cuboid-shaped box. The vacuum chamber 80 includes a ceiling wall, a bottom wall, and plural side walls, and the plural side walls include a front surface wall 81, a rear surface wall 82, and right and left side surface walls 84. The vacuum chamber 80 houses a degassing portion which is the same as the degassing portion 14 according to the first embodiment. That is, the degassing portion includes plural rollers 86 arranged separately at upper and lower sides and plural plate heaters 88. The front surface wall 81 and the rear surface wall 82 support both end portions of each of the rollers 86 via bearings so that the roller 86 is rotatable, and the front surface wall 81 and the rear surface wall 82 support both end portions of each of the plate heaters 88 in the width direction thereof.

Openings 90 allowing the plural rollers 86 and the plural plate heaters 88 to be opened to the outside along an axial direction of the rollers 88 are formed in the front surface wall 81 and the rear surface wall 82, respectively. Likewise, openings 92 allowing the degassing portion to be opened to the outside in the right and left direction are formed in the right and left side surface walls 84. Further, doors 93 and doors 94 for opening and closing the openings 90 and the openings 92, respectively are formed in the walls 81, 82 and the walls 84 so as to rotate via hinges. The doors 93 and the doors 94 close the openings 90 and the openings 92, thereby sealing a degassing space within the vacuum chamber 80. Meanwhile, the doors 93 and the doors 94 open the openings 90 and the openings 92, thereby enabling an operation such as maintenance through the openings 90 and the openings 92.

The vacuum chamber 80 configured as described above can also hold a heat shield panel 70, which is the same as the heat shield panel 70 according to the first embodiment, so that the heat shield panel 70 is detachable. Thus, it is preferable that the vacuum chamber 80 is configured to include a pair of lower and upper heat shield panel double-supporting portions 96, 98. The heat shield panel double-supporting portions 96, 98 are provided in appropriate positions in the up and down direction so as to be fixed to the front surface wall 81 and the rear surface wall 82, thereby holding the corresponding heat shield panel 70 from above and below. Such configuration allows the heat shield panel 70 to be horizontally inserted through the openings 90 or the opening 92 and attached between the heat shield panel double-supporting portions 96, 98. The heat shield panel 70 inserted can be fixed by a bolt or the like to at least one of the heat shield panel double-supporting portions 96, 98.

On the other hand, it is not necessarily required that the heat shield member according to the present invention is detachable. For example, in an apparatus which treats only a substrate having a predetermined substrate width, attachment and removal of the heat shield member is not necessarily required. Even in such case, each roller and a heating surface of a heater have a roller exposed portion and a heating surface exposed portion, respectively, when a roller width of the roller is designed to be greater than the substrate width in order to surely feed the substrate and when a width of the heating surface of the heater is designed to be greater than the substrate width in order to inhibit the substrate from being unevenly heated. Therefore, the heat shield member is arranged so as to shield heat radiation from the heating surface exposed portion to the roller exposed portion; thereby, a temperature rising of the roller due to the heat radiation can be inhibited.

Figure 14:
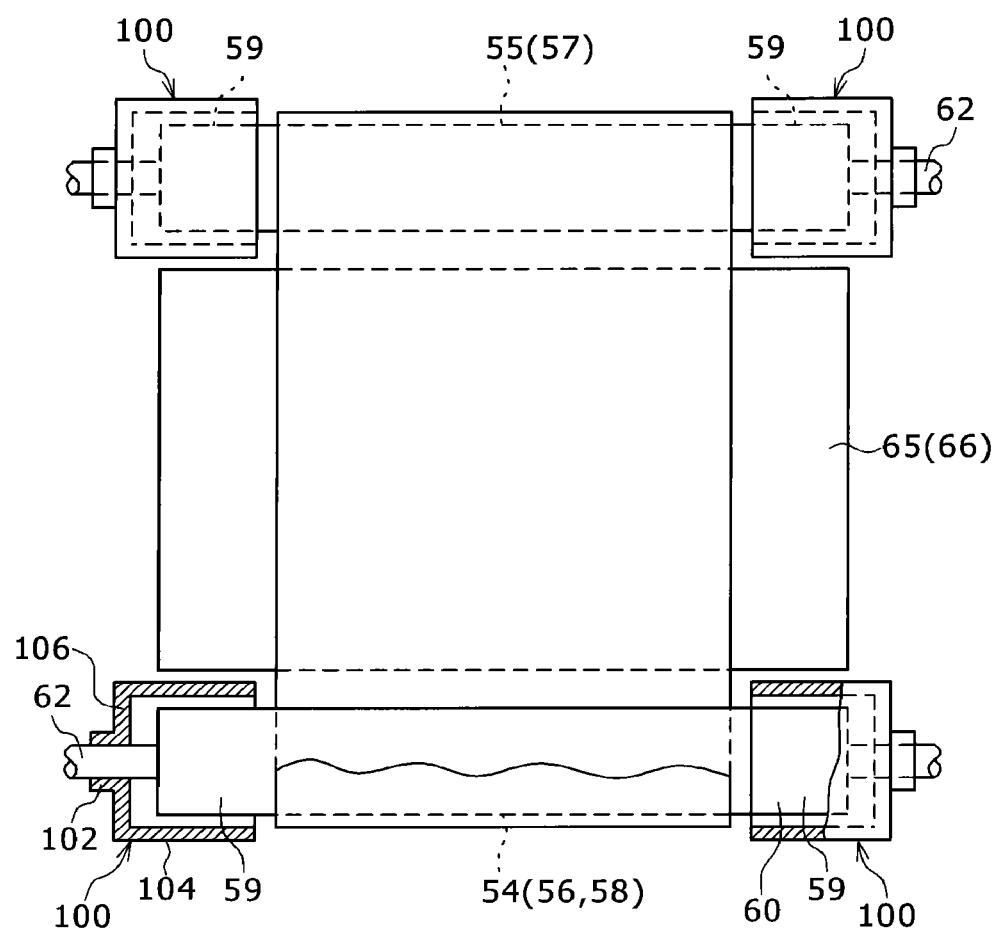
FIG. 14 is a partial side sectional view of the degassing apparatus according to a third embodiment of the present invention.

The present invention does not restrict the concrete shape and arrangement of the heat shield member. For example, the heat shield member according to the present invention is not limited to the heat shield panel 70 that covers the heating surface exposed portion 69 as described above. The heat shield member of the present invention may be a member provided between a heating surface exposed portion and a roller exposed portion so as to shield heat radiation from the heating surface exposed portion to the roller exposed portion. Alternatively, for example, the heat shield member of the present invention may have a cylindrical shape so as to cover an outer circumferential surface of the roller exposed portion from the outside thereof. Such example is shown as a third embodiment of the present invention in FIG. 14.

The degassing apparatus according to the third embodiment includes plural cylindrical heat shield members 100 instead of the heat shield panel 70 in the degassing apparatus according to the first embodiment. Each of the heat shield members 100 has a shape which covers the roller exposed portion 59 of each of the rollers 54 to 58. The heat shield member 100 is detachably fixed to the roller support shaft 62 integrally rotating with each roller 54 to 58. In particular, each heat shield member 100 includes a roller fixing portion 102, a heat shield portion 104, and a connecting portion 106. The roller fixing portion 102 is of a cylindrical shape having a small diameter and fixed onto an outer circumferential surface of the roller support shaft 62. The heat shield portion 104 is of a cylindrical shape having an inner diameter greater than an outer diameter of the roller exposed portion 59 so as to cover a radially outward side of the roller exposed portion 59. The connecting portion 106 is of an annular plate shape which is positioned at the outer side of each roller 54 to 58 in the width direction thereof so as to be radially connected to the roller fixing portion 102 and the heat shield portion 104.

The heat shield members 100 can also inhibit roller exposed portions of rollers to which the heat shield members 100 are to be attached from being heated by heat radiation from a specific heating surface exposed portion. In addition, each heat shield member 100 is circumferentially split, for example, into a halved configuration. Therefore, the heat shield member 100 can be attached to and removed from each roller 54 to 58 in a state where each roller 54 to 58 is supported by a chamber, i.e., in a state where each roller 54 to 58 is not removed from the chamber.

Compared with the heat shield member 100 according to the third embodiment, the heat shield panel 70 according to the first embodiment has advantages of being simply shaped to shield heat radiation and of being easily arranged. In particular, the heat shield panel 70 is different from the heat shield member 100 arranged adjacent to the outer circumferential surface 60 of the roller exposed portion 59 and may not make contact with the outer circumferential surface 60 at the time of setting the heat shield panel 70. Therefore, the heat shield panel 70 can be more easily arranged in a predetermined position than the heat shield member 100.

The present invention does not restrict the concrete configuration and arrangement of plural rollers and a heater. For example, the plural rollers may be arranged so as to feed a substrate in a meandering manner, but not limited to such arrangement. The plural rollers may be variously arranged depending on pathways for feeding desired substrates. In addition, the heater may be configured so that both surfaces of a plate-shaped heater body form heating surfaces as with the plate heater 65, 66, but not limited to such configuration. Alternatively, the heater may include a single heating surface.

Figure 15:
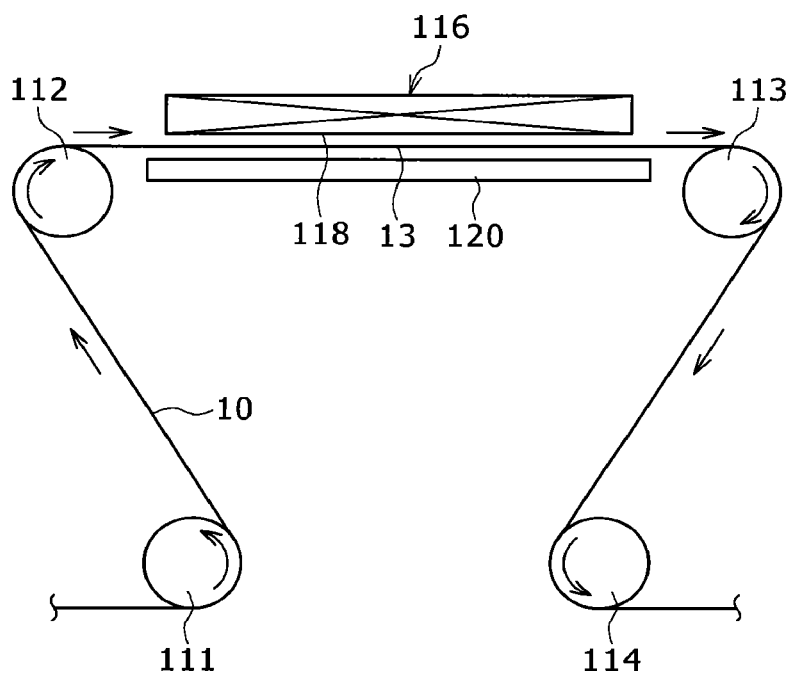
FIG. 15 is a front view of the degassing apparatus according to a fourth embodiment of the present invention.

Such example is shown as a fourth embodiment of the present invention in FIG. 15. The degassing apparatus according to the fourth embodiment includes: four rollers 111, 112, 113, and 114 arranged from the upstream side in the feeding direction of the substrate 10 in the mentioned order; and a heater 116. The roller 112 and the roller 113 of the rollers 111 to 114 are located on the substantially same level in the up and down direction, and the roller 111 and the roller 114 are located in a position lower than the roller 112 and the roller 113. The heater 116 having a single heating surface 118 is arranged so that the heating surface 118 faces a surface of a horizontally extending portion 13 of the substrate 10 to be fed between the rollers 112 and 113.

In the degassing apparatus of the fourth embodiment, in a case where the heater 116 needs to be arranged above the horizontally extending portion 13 of the substrate 10, i.e., in a case where the heating surface 118 of the heater 116 needs to be arranged so as to face downward, for convenience of the layout of the degassing apparatus, heating surface exposed portions of the heating surface 118, which protrude outward from ends of the substrate 10 in the width direction thereof, may heat roller exposed portions of the lower rollers 111, 114, which protrude outward from the ends of the substrate 10 in the width direction thereof, by heat radiation. In such case, a heat shield member for shielding the heat radiation from the heating surface exposed portions to the roller exposed portions, for example, a heat shield panel 120 positioned at a lower side of the heating surface 118 to cover the heating surface exposed portions of the heating surface 118 is provided as shown in FIG. 15; thereby, a temperature rising of the rollers 112, 113 due to the heat radiation can be inhibited.

The present invention includes the foregoing fourth embodiment while being especially effective in a case where as in the first embodiment, the plural upper and lower rollers that move the substrate in a meandering manner are combined with the plate heater that is arranged to face the vertically extending portion of the substrate. In such type of the degassing apparatus, the foregoing combination enables the degassing treatment of the substrate to be effectively performed by a compact configuration. On the other hand, according to the present invention, the upper rollers and the lower rollers are provided closely to one another in the moving direction, and a distance between the heating surface exposed portion of the heater axially protruding from the substrate and the roller exposed portion of the corresponding specific roller to the heating surface exposed portion is small. Therefore, in a case where the outer circumferential surface of the roller exposed portion is heated by heat radiation from the heating surface exposed portion, a temperature of the roller exposed portion remarkably increases. The heat shield member according to the present invention is applied to the degassing apparatus of the foregoing type; thereby, the temperature of the specific roller can be effectively inhibited from increasing regardless of whether each of the rollers and the plate heater are provided closely.

What is claimed is:

1. A heat treatment apparatus for performing a heat treatment of a substrate by heating the substrate while feeding the substrate in a longitudinal direction of the substrate, the substrate having a strip shape which extends in the longitudinal direction and a specific substrate width, the heat treatment apparatus comprising:
   a plurality of rollers guiding the substrate to be fed along a predetermine pathway, each of the rollers including an outer circumferential surface which is contactable with the substrate and a roller width which is greater than the specific substrate width;
   a heater including a heating surface which has a width greater than the specific substrate width, the heater being arranged so that the heating surface faces a surface of the substrate fed along the pathway, the heater heating the substrate by heating from the heating surface; and
   a heat shield member inhibiting the outer circumferential surface of the specific roller included in the plurality of rollers from being heated by heat radiation from the heating surface, the heat shield member being arranged between a heating surface exposed portion of the heating surface, which is exposed while protruding from an end of the substrate in a width direction of the substrate along the width direction and a roller exposed portion of the specific roller, which is exposed while protruding from the end of the substrate in the width direction to the same direction in which the heating surface exposed portion protrudes, the heat shield member being shaped to shield the heat radiation from the heating surface exposed portion to the outer circumferential surface of the roller exposed portion.

2. The heat treatment apparatus according to claim 1, further comprising a chamber surrounding a heat treatment space to house the plurality of rollers and the heater in the heat treatment space, the chamber including a heat shield member holding portion which holds the heat shield member so that the heat shield member is detachable.

3. The heat treatment apparatus according to claim 1, wherein the heat shield member is a heat shield panel which is arranged along a heating face of the heating surface exposed portion so as to face the heating face and cover the heating face.

4. The heat treatment apparatus according to claim 1, wherein the plurality of rollers includes a plurality of upper rollers which are arranged at intervals in a predetermined horizontal moving direction and a plurality of lower rollers which are arranged in a position lower than the upper rollers and at intervals in the moving direction, and
   wherein the heater is a plate heater arranged in a vertically standing manner between portions of the substrate, which are fed in an up and down direction between the upper rollers and lower rollers and which are provided adjacent to each other in the moving direction.

* * * * *